(12) United States Patent
Obata

(10) Patent No.: US 8,325,867 B2
(45) Date of Patent: Dec. 4, 2012

(54) WAVEFORM SIGNAL GENERATOR WITH JITTER OR NOISE ON A DESIRED BIT

(75) Inventor: Toshiaki Obata, Yokohama (JP)

(73) Assignee: Tektronix, Inc., Beaverton, OR (US)

( * ) Notice: Subject to any disclaimer, the term of this patent is extended or adjusted under 35 U.S.C. 154(b) by 1104 days.

(21) Appl. No.: 12/239,638

(22) Filed: Sep. 26, 2008

(65) Prior Publication Data

US 2009/0086873 A1 Apr. 2, 2009

(30) Foreign Application Priority Data

Sep. 28, 2007 (JP) ................................. 2007-255255

(51) Int. Cl.
*H04L 7/00* (2006.01)
(52) U.S. Cl. ........ 375/371; 375/224; 375/226; 375/227; 375/228; 345/440; 345/440.1; 345/441; 345/442
(58) Field of Classification Search .................. 375/371, 375/224, 226, 227, 228; 345/440, 440.1, 345/441, 442
See application file for complete search history.

(56) References Cited

U.S. PATENT DOCUMENTS

| | | | | |
|---|---|---|---|---|
| 4,656,428 A | * | 4/1987 | Ishikawa | 327/106 |
| 4,905,172 A | * | 2/1990 | Randle | 702/117 |
| 6,806,877 B2 | | 10/2004 | Fernando | |
| 2004/0205431 A1 | * | 10/2004 | Moore et al. | 714/728 |
| 2005/0038616 A1 | * | 2/2005 | Sasaki | 702/69 |

* cited by examiner

*Primary Examiner* — Siu Lee
(74) *Attorney, Agent, or Firm* — William K. Bucher

(57) ABSTRACT

Waveform data of selected bits having jitter or noise is generated wherein the waveform date represents a serial digital signal. A signal generator displays a jitter/noise setting area and a bit selection area on a display device where jitter or noise is set and the jitter or noise settings are applied to only the bit selected with the bit selection area. The bit is selected through various ways. A user may directly input a bit pattern to be selected. Box objects corresponding to the respective bits in the digital signal may be displayed and one or more of the bits can be selected by selecting one of the box objects. Frequently used bit patterns may be stored and provided using a menu-driven interface for selecting a bit pattern. An arbitrary number of consecutive bits may be designated for receiving jitter or noise and displayed.

14 Claims, 9 Drawing Sheets

WAVEFORM SIGNAL GENERATOR WITH JITTER OR NOISE ON A DESIRED BIT

BACKGROUND OF THE INVENTION

The present invention relates generally to signal generators and more particularly a signal generator for generating jitter or noise on a selected bit in a serial digital signal output and displaying characteristics of a serial digital signal output.

Electronic instruments using microprocessors, such as a personal computer, test and measurement instruments and the like, use serial data transfer between devices for faster data transfer rate, even though a CPU processes the data in parallel. Serial transmission paths have a data transmitter side that converts the parallel data into serial data (a serial digital signal) and a data receiver side that converts the serial data into the parallel data.

The serial digital signal transfers digital data in the form of "1s" and "0s" with the digital serial signal waveform having ideal edges representing rectangular transitions in the signal. FIG. 1 shows a serial digital signal having rising and falling edges representing rectangle transitions. If the propagation path between a transmitter and a receiver is ideal, the transition edges of the waveform will not change even after the propagation and would be an ideal waveform as indicated by the dotted line. A serial digital signal may transmit one or more bits during a symbol period T according to a particular modulation method. FIG. 1 shows a one bit case. The receiver detects values of the serial digital signal every symbol period T to demodulate the "1s" and "0s" of the digital data.

As shown as solid lines in FIG. 1, an actual transferred serial digital signal usually has distortions relative to ideal serial digital signal depending on the characteristics of the propagation path, the signal speed, etc. The information transferred by the serial digital signal is "1s" and "0s" but the signal itself is an analog electric signal. A waveform display apparatus, such as a digital oscilloscope, may be used for storing waveform data of the serial digital signal to display the eye pattern for measuring the characteristics of the jitter and the like in the serial digital signal.

FIG. 2 shows an eye pattern display of waveform data acquired with a waveform display apparatus. The serial digital signal acquired as the waveform data may be a 32 bit signal transferred as packets and the eye pattern may be displayed by repetitively overlaying the signal waveforms of the respective bits. In the eye pattern display, the larger the waveform distortion is, the smaller the area size of the eye pattern becomes or the larger difference from the ideal shape it has. U.S. Pat. No. 6,806,877 discloses the invention that measures the shape or area size of an eye for evaluating the quality of the digital signal. The eye pattern display indicates the frequency of occurrences of the overlain signal waveforms using varying colors. That is, the higher the frequency of occurrence results in a color closer to the red and the lower the frequency of occurrence results in a color closer to violet. The eye pattern is also called as an eye diagram.

The serial digital signal waveform may be analyzed for digital signal quality by characterizing jitter characteristics of rising and falling edges of a waveform. The results of the jitter characteristics are displayed with known various graphs. For example, FIG. 3 is a graph of a time trend of jitter wherein the horizontal and vertical axes respectively indicate time and jitter size to show how much the jitter size changes with time. FIG. 4 is a histogram showing jitter frequency. Jitter derived from heat of a device, for example, has a histogram represented by a Gaussian curve having a peak around jitter amount zero. However, pattern dependent, i.e. "0s" and "1s" may have a histogram as shown in FIG. 4. Additional signal characteristics, such as jitter spectrums for analyzing the frequency components of the jitter, the maximum and minimum values of the jitter, etc., may be displayed as graphs and/or numeric values.

In a development process of an electronic instrument, it is required to confirm whether the circuits (circuits under test) in the electronic instrument work properly. One way is to provide signals required for the circuit operation with a signal generator and observe the signals in the circuits under test with an oscilloscope, logic analyzer or the like.

Digital circuits and transmission paths generally generate noises and/or jitter on digital signal. Then, it is desired that the signal generator generates a digital signal that reflects such noises and/or jitter. However, a conventional signal generator can not provide a digital signal that includes bit pattern dependent jitter. Therefore, if a system has circuits, and data in which a bit sequence is not repetitive, such as PRBS (Pseudorandom Binary Sequence) flowing in one circuit while and affected by other circuits, it is difficult to analyze and evaluate such a system using the signal generator.

Therefore, it is desired that a signal generator can provide a signal that jitter and/or noises are selectively added to only desired potions of the output signal.

SUMMARY OF THE INVENTION

A signal generator according to the present invention stores waveform data representing a serial digital signal in a memory means such as a waveform memory. A display device shows a screen for selecting a desired bit in the serial digital signal. The screen can be operated with the operation panel, mouse, etc. to work as a bit selecting means. The screen also displays objects for setting desired jitter or noise on the selected bit, and is operated similarly with the operation panel, mouse, and the like to work as jitter or noise setting means. The signal generator has a controller such as a CPU that makes the waveform data reflect the jitter or noise settings. A waveform generation means generates the waveform data reflecting the jitter or noise settings.

The signal generator according to the present invention may display the characteristics of the waveform data reflecting the jitter or noise settings as an eye pattern, numeric values, graphs, and the like. Therefore, a user can confirm the characteristics of the signal to be output in advance, and consider whether additional setting adjustment is necessary.

The signal generator according to the present invention can display an arbitrary bit of a waveform and discriminate the arbitrary bit of the waveform from the waveforms of the other bits when an eye pattern of the waveforms is displayed. The user can visually confirm whether the jitter or noise of the desired bit is expected. A waveform selecting means such as a mouse may be provided for selecting one or more of the waveforms displayed as the eye pattern, and only the selected waveform may be displayed for easily confirming the settings.

The bit selecting means may provide selectable bit patterns such as "01", "10", etc. through a menu-driven interface. Alternatively, an arbitrary number of bits may be for selected in the serial digital signal with the bit selecting means. The arbitrary number of selected bits may be consecutive bits of the serial digital signal.

The objects, advantages and other novel features of the present invention are apparent from the following detailed description when read in conjunction with the appended claims and attached drawings.

DETAILED DESCRIPTION OF THE INVENTION

Figure 5:
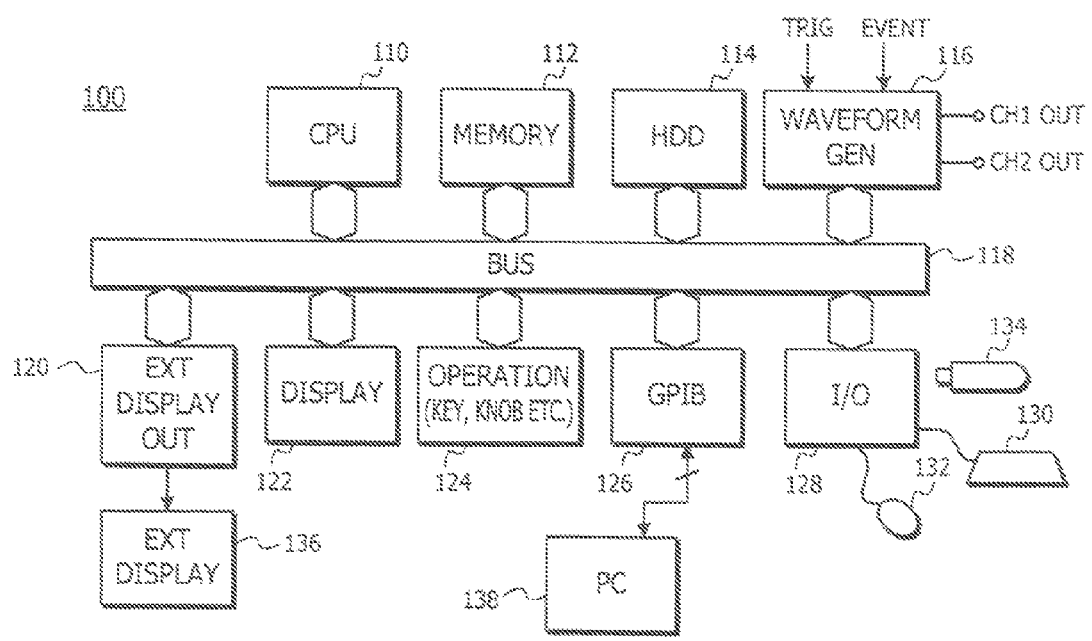
FIG. 5 is a block diagram of a signal generator according to the present invention.

FIG. 5 is a block diagram of a signal generator according to the present invention. The signal generator 100 may provide an electronic signal having a desired waveform according to user settings. A CPU (central processing unit) 110 controls the apparatus according to programs stored in a hard disk drive (HDD) 114. The HDD is also used for storing a large quantity of data. A memory 112 having RAM is used for reading programs from the HDD 114 and temporal processing while exchanging the data with the CPU 110. A user may set up the signal generator 100 with an operation panel (operation means) 124 that may include key, knob, buttons and the like. A display 122 provides visual information on signal patterns and/or settings that the user requires. An external display output 120 provides a video output and may be coupled to an external display 136 to provide a larger display area along with the built-in display 122.

A waveform generation circuit 116 has a waveform memory, digital to analog converters and produces fast waveform data to generate electronic signals from the waveform data. In this embodiment, it has two output channels. An input/output port 128 may be used for coupling an external key board 130, pointing device such as mouse 132, and the like that may function as a part of the operating means for setting up the signal generator 100. If an USB memory 134 is coupled to the input/output port 128, waveform data acquired with an external oscilloscope can be copied to the signal generator 100. The blocks are coupled each other via a bus 118. A GPIB (General Purpose Interface Bus) interface may be provided on the bus 118 to couple the signal generator 100 with an external PC 134. The external PC 134 may remotely control the signal generator 100 as desired. If a LAN (Local Area Network) interface is used in place of the GPIB interface, the signal generator 100 could be controlled with an external PC through the network.

The present invention may be realized by adding new features into the conventional signal generator described with FIG. 5 via installing programs. Operating systems (OS) that may be used in a PC may be installed on the signal generator, which allows GUI (Graphical User Interface) operation with a mouse and the like. Multiple windows can be opened and each may display different information.

Figure 6:
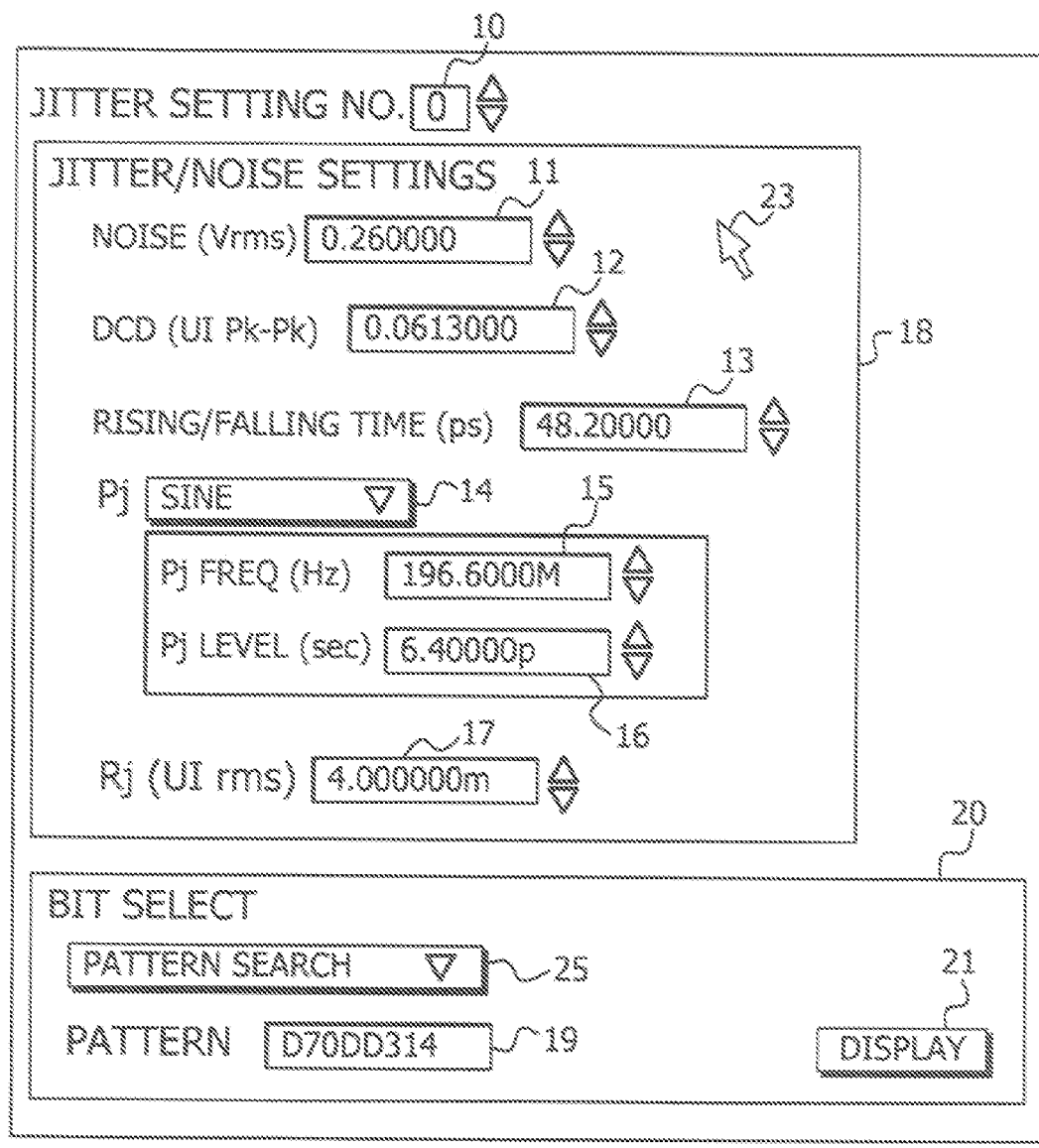
FIG. 6 is a display screen according to the present invention.

FIG. 6 is an example of a display screen of the signal generator according to the present invention. The screen has jitter/noise setting area 18, bit selection area 20 that are operated by a user with an operation panel 124, a keyboard 130, a mouse 132 producing a mouse cursor 23, and the like and work as jitter or noise setting means and bit selecting means, respectively.

A jitter setting number field 10 is used to set an integer number with each number corresponding to one set of settings. Bits selected with the bit selection area 20 and the corresponding jitter/noise settings area 18 are stored as a set of the settings in the signal generator corresponding to the number in the filed 10. In the description below, a value in a field can be changed by clicking an upward or downward arrow provided at the right of each field with the mouse cursor.

The user can set jitter or noise to bits that are selected with the jitter/noise setting area 18 as described below using FIG. 6. A noise value is set in field 11 as a voltage RMS (root mean squared) value for adding the noise defined by the voltage RMS value to the bits selected with the bit selection area 20. A peak to peak value of DCD (Duty Circle Distortion) that indicates a difference between the pulse durations of logical "1" and "0" is set in a field 12. A rising/falling time of leading and trailing edge transitions of selected bits is set in a field 13. The rising/falling times of the selected bits are different from the rising/falling times of the other bits, which leads to jitter as a result. This embodiment shows such a case as setting the rising and falling times the same but they may be set independently.

A pull-down menu 14 provides jitter types used for Pj (Periodic jitter) wherein FIG. 6 shows a sine wave as the selected case. The frequency and level (unit is time) are set with fields 15 and 16. This allows the settings of the periodic jitter that is jitter of the rising/falling edges in time direction. A value of Rj (Random Jitter) is set in a field 17.

The bit selection area 20 has a selection menu 25 for selecting a bit selection mode. One such bit selection mode is a "PATTERN SEARCH MODE" as shown. The user selects a bit pattern by inputting a desired bit pattern in a field 19. The selection menu 25 in the bit selection area 20 provides a bit selection mode menu described below as a pull-down menu when a user clicks a triangle object at the right with the mouse cursor 23. The selectable modes in the pull-down menu may be "SKIP AND SHOW MODE OFF", "SKIP AND SHOW", "SHOW AND SKIP", "BIT INDIVIDUAL DESIGNATION" and "BIT PATTERN", for example.

Figure 7:
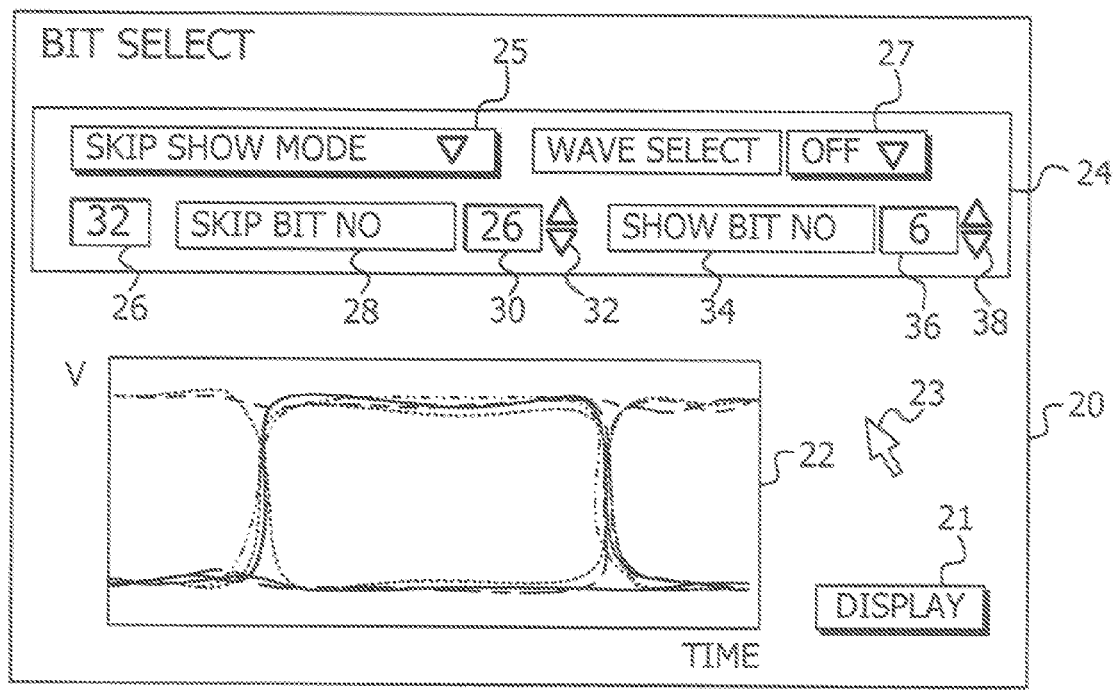
FIG. 7 is a display example of a SKIP AND SHOW MODE according to the present invention.

The "SKIP AND SHOW MODE Off" mode selects all bits of the serial digital signal where all bits are targets of the jitter/noise settings. The "SKIP AND SHOW" mode as shown in FIG. 7 skips a user selected number of bits from the beginning of the serial digital signal and shows a user selected number of bits of the serial digital signal remaining in the serial digital signal in an eye pattern of the waveforms. Conversely, the "SHOW AND SKIP" mode shows a user selected number of bits from the beginning of the serial digital signal in an eye pattern of waveforms and skips a user selected number of bits from the remaining bits of the serial digital signal.

Figure 8:
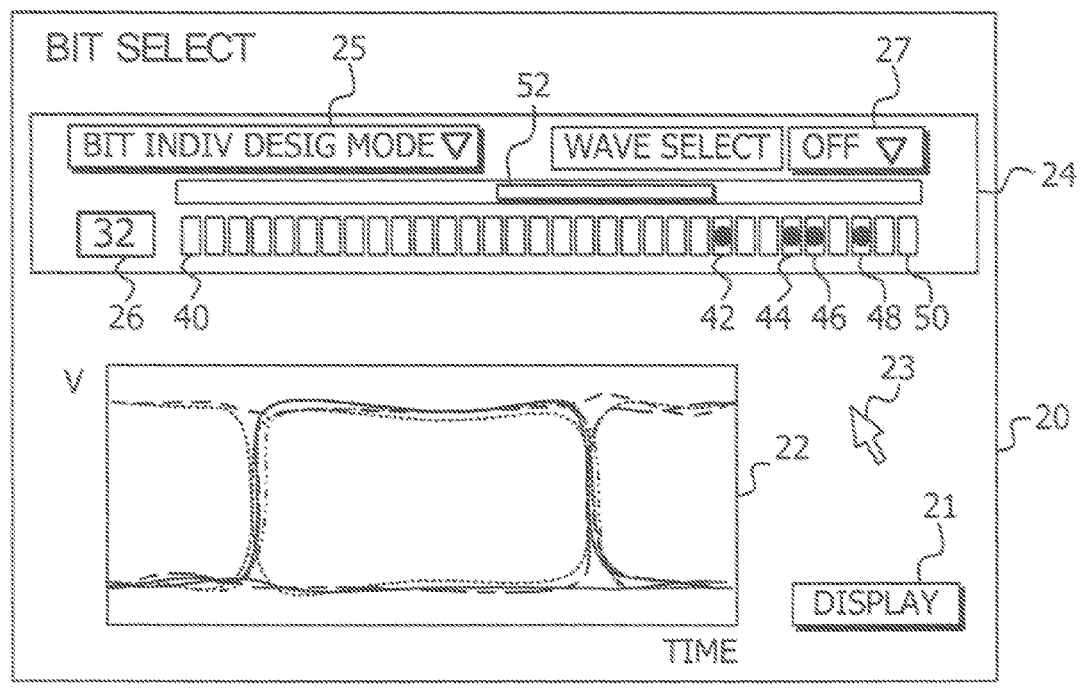
FIG. 8 is a display example of a "BIT INDIVIDUAL DESIGNATION" mode according to the present invention.
Figure 9:
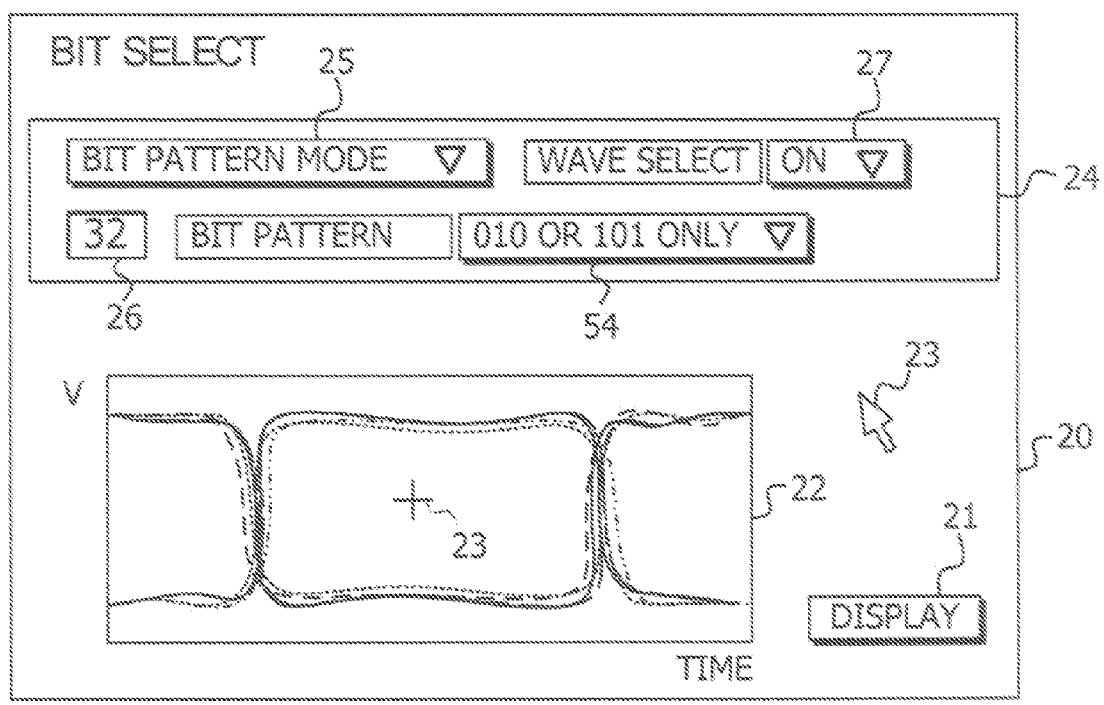
FIG. 9 is a display example of a "BIT PATTERN" mode according to the present invention.

The bit selection area 20 in FIGS. 7-9 has a waveform display area 22 showing waveforms of the user selected show bits as eye patterns of the with different patterns, such as solid line, dashed line, dotted line with points and the like, representing different colors to easily identify each waveform. Note that each waveform can be recognized in the eye pattern which is different from the eye pattern of FIG. 2 where the eye pattern represents the frequency of occurrences of the waveform data. For the simplicity of the figures, the numbers of the waveforms are considerably smaller than that of an actual average case.

A total bit number display field 26 indicates the total bit number in the serial digital signal. In this example, bit pattern has 32 bits. A bit skip/show number field 28 indicates whether the bits from the beginning of the serial digital signal the "SKIP AND SHOW" mode or shown in the "SHOW AND SKIP" mode. A user uses a skip/show designation field 30 for designating the number of bits to skip from the beginning of the serial digital signal in the "SKIP AND SHOW" mode or the number of bits to show from the beginning of the serial digital signal in the "SHOW AND SKIP" mode. Another bit skip/show number field 34 indicates whether the remaining bits of the serial digital signal are to be shown in the "SKIP AND SHOW" mode or skipped in the "SHOW AND SKIP" mode. A user uses a skip/show designation field 36 for designating the number of remaining bits to show in the serial digital signal in the "SKIP AND SHOW" mode or the number of remaining bits to skip in the serial digital signal "SHOW AND SKIP" mode. The bit number designation fields 30 and 36 are controlled to be interlocked so that if the user changes one of them the other is automatically changed as the total bit number is equal to the number indicated in the total bit number display field 26.

Additionally, "ARBITRARY DESIGNATION SKIP AND SHOW" mode and "ARBITRARY DESIGNATION SHOW AND SKIP" mode may be provided as applications of the "SKIP AND SHOW" mode. These modes allow designating sets of the skip bit numbers and the show bit numbers that designate arbitrary numbers respectively. For example, characters and number may be input through the screen like "first skip: 3 bits, first show: 4 bits, second skip: 6 bits, second show: 8 bits, third skip: 7 bits, third skip: 5 bits". The order of skip and show may be the order of show and skip. The example shows three of the skip and show sets but it is not limited to three but an arbitrary number of the sets is available.

FIG. 8 shows the selection menu 25 set to a "BIT INDIVIDUAL DESIGNATION" mode. Objects in FIG. 8 corresponding to those of FIG. 7 are described by use of the same reference numerals. When the Bit Individual Designation mode is selected by use of mode selection menu 25, box objects corresponding to the respective bits of the serial digital signal are displayed. In the example of FIG. 8, box 40 corresponds to the first bit of the serial digital signal, a box 50 corresponds to the last bit of the serial digital signal, and middle boxes from left to right correspond sequentially to other bit of the serial digital signal. In operation, a user clicks some or all of the box objects with mouse cursor 23 to select desired bits. In FIG. 8, black circles are shown in the centers of box 42 for 24th bit, box 44 for 27th bit, box 46 for 28th bit, and box 48 for 30th bit to indicate that they have been selected.

If the number of bits in the serial digital signal is too large for all of the corresponding box objects to be displayed simultaneously on the display screen, a slider 52 may be additionally displayed to allow the user to slide the box objects to the right and left by sliding the slider 52 using the mouse cursor 23, so as to be able to access and designate any of the bits. Additionally, when the mouse cursor 23 is positioned close to one of the box objects, a text message of "XXth bit" may be displayed for a given time to confirm with text exactly which bit that particular box corresponds to.

FIG. 9 shows the selection menu 25 set to a "BIT PATTERN" mode of operation. Objects in FIG. 9 corresponding to those of FIG. 7 are designated by the same reference numerals. In this mode of operation, bit patterns that are frequently used are pre-installed in advance in a bit pattern pull down menu 54. The user may select a desired bit pattern from the bit patterns appearing in a pull down menu 54 by clicking a triangle object at the right side of the pull down menu 54 using mouse cursor 23.

Figure 10:
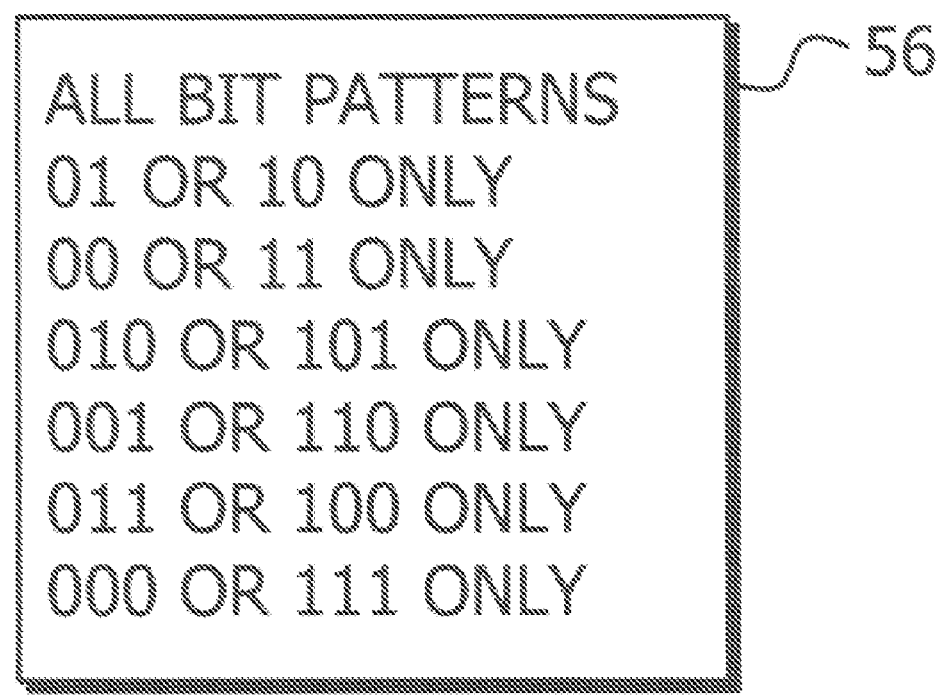
FIG. 10 is a pull down menu example of selectable bit patterns according to the present invention.

FIG. 10 shows an example of a menu 56 that the pull down menu 54 provides. It may have predetermined patterns such as, "01 or 10 only", "00 or 11 only", "010 or 101 only", "001 or 110 only", "011 or 100 only" and "000 or 111 only". This easily allows generating a serial signal having jitter depending on the bit pattern. The menu 56 additionally has "All bit patterns" which leads to jitter/noise settings covering all bits similar to the "SKIP AND SHOW MODE Off" mode.

In the embodiments of FIGS. 7-9, other windows may display jitter characteristics as graphs or numeric values in place of or along with the eye pattern display. The graphs may be time trend, spectrum, histogram, max/min, etc. as similar to the conventional ones.

Figure 11:
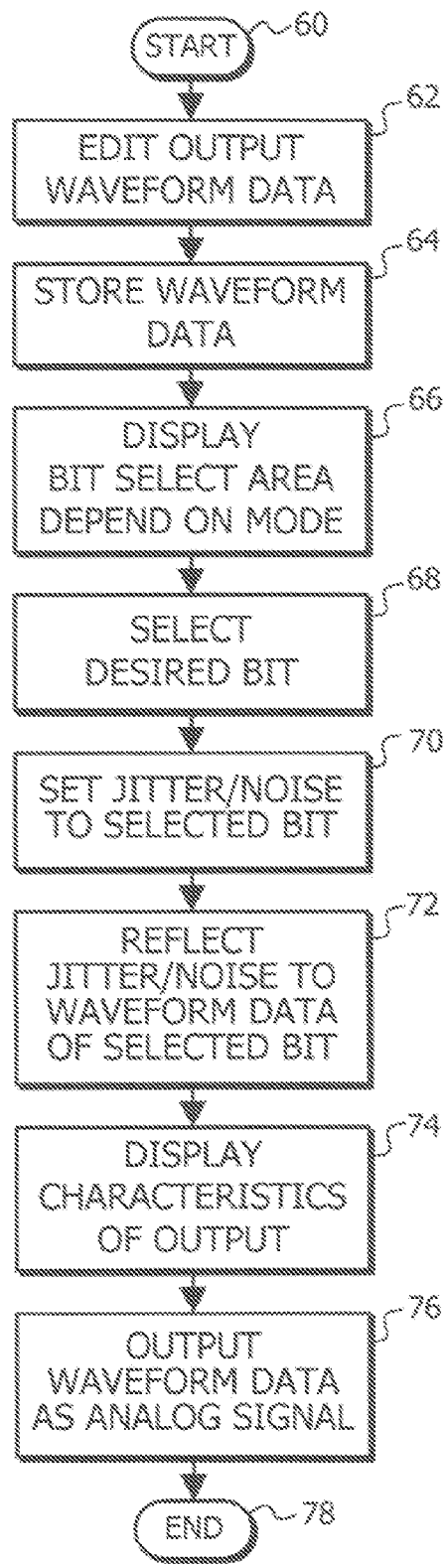
FIG. 11 is a flow chart according to the present invention.

FIG. 11 is a flowchart showing processes in the signal generator according to the present invention. Waveform data representing an output serial digital signal is edited in well known methods (step 62) and stored in a waveform memory in the waveform generation circuit 116 (step 64). The waveform may be derived by modifying waveform data acquired with an oscilloscope. If a user selects a mode with the mode selection menu 25, the display of the bit selection area 20 is changed according to the selected mode (step 66). As described above, the user selects desired bit or bits (step 68) and sets jitter or noise settings only to the selected bit or bits (step 70). The CPU of the signal generator add the jitter or noise to the selected bit or bits of the waveform data and generate new waveform data which is stored in the waveform memory (step 72). If a display button 21 is clicked at this stage, the characteristics of the digital signal that is going to be output is displayed as an eye pattern, jitter analysis graph, or the like (step 74). This allows the user can confirm whether the characteristics of the digital signal to be output are what the user expected. The waveform data reflecting the jitter or noise is provided as an electronic signal representing the serial digital signal from the signal generator by conducting output operation of the signal generator (step 76).

Figure 1:
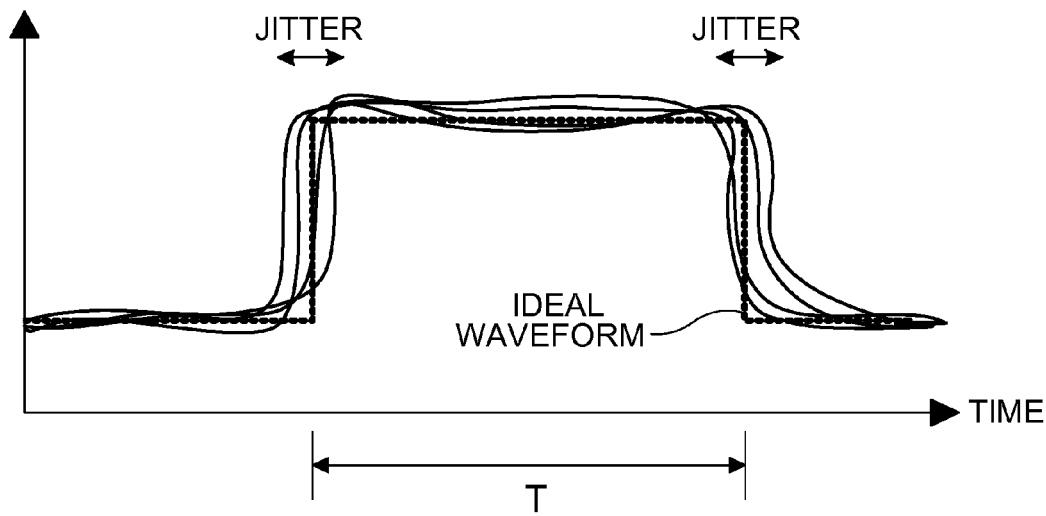
FIG. 1 is a graph of a digital serial signal waveform having ideal edges representing rectangular transitions.
Figure 2:
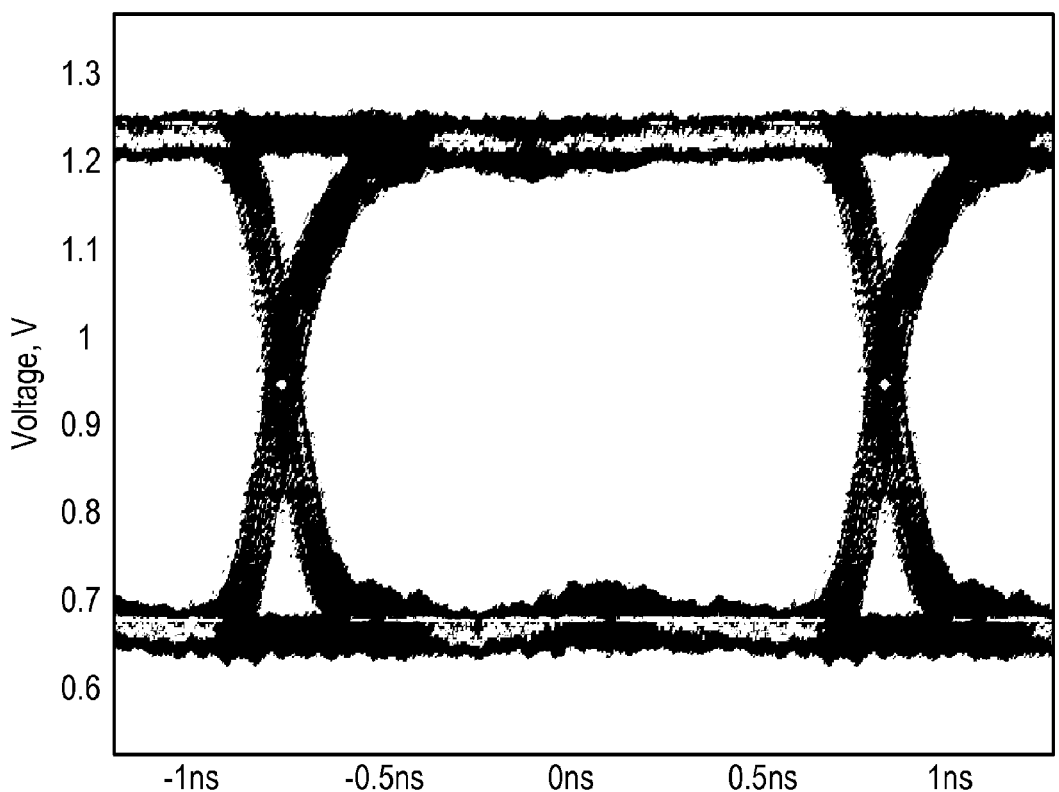
FIG. 2 is an eye pattern display of a digital serial signal.
Figure 3:
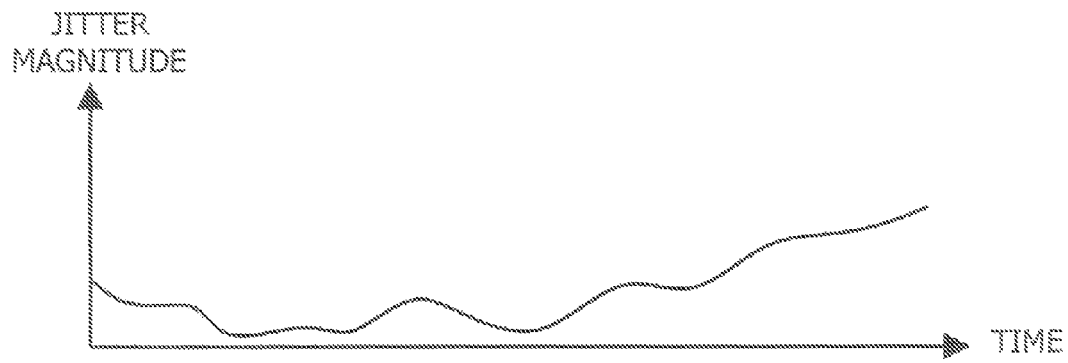
FIG. 3 is a time trend display of jitter characteristics.
Figure 4:
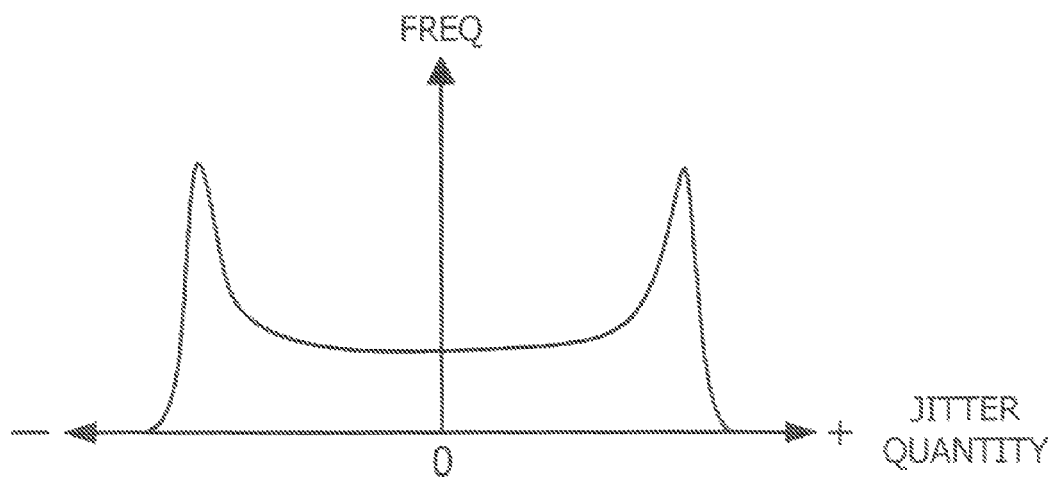
FIG. 4 is a histogram display of jitter characteristics.

Although the invention has been disclosed herein in terms of the preferred embodiment, those skilled in the art will appreciate that modifications and improvements may be made without departing from the scope of the invention. When the characteristics of the waveform data are displayed with the eye pattern, jitter analysis graph, or the like, only the waveforms corresponding to the bits that the jitter or noise is added may be displayed. In cases of FIGS. 7-9, only the waveforms corresponding to the selected bits may be displayed by turning on the waveform selection ON/OFF menu 27. This makes it easy to confirm whether the jitter or noise settings is proper. An eye pattern is usually displayed as each waveform can not be discriminated as shown in FIG. 2. However, the present invention uses an eye pattern display that each waveform can be identified so that the user may display only the waveforms that are selected with the mouse cursor 23.

What is claimed is:

1. A signal generator comprising:
   a means for storing waveform data representing a serial digital signal;
   a bit selecting means for selecting a desired bit in the serial digital signal;
   a means for setting desired jitter or noise to the desired selected bit;

a control means for making the waveform data reflect the jitter or noise; and a means for regenerating the waveform data reflecting the jitter or noise.

2. The signal generator as recited in claim 1 wherein the signal generator displays characteristics of the waveform data reflecting the jitter or noise.

3. The signal generator as recited in claim 1 wherein the waveform data is displayed as an eye pattern and the waveform corresponding to the selected bit is displayed and discriminated from the waveforms of the other bits.

4. The signal generator as recited in claim 3 further comprising a means for selecting and displaying one of the waveforms displayed as the eye pattern.

5. The signal generator as recited in claim 1 wherein the bit selecting means provides selectable bit patterns.

6. The signal generator as recited in claim 1 wherein an arbitrary number of bits in the serial digital signal can be designated with the bit selecting means.

7. The signal generator as recited in claim 6 wherein the arbitrary number of bits in the serial digital signal are consecutive bits designated with the bit selecting means.

8. A method for generating waveform data in a signal generator comprising steps of:

storing waveform data representing a serial digital signal;
selecting a desired bit in the serial digital signal;
setting desired jitter or noise to the selected bit;
reflecting the jitter or noise to the waveform data; and
regenerating the waveform data reflecting the jitter or noise.

9. The method as recited in claim 8 further comprising a step of displaying the characteristics of the waveform data reflecting the jitter or noise.

10. The method as recited in claim 8 further comprising a step of displaying the regenerated waveform data as an eye pattern and a waveform corresponding to the selected desired bit is displayed and discriminated from the waveforms of the other bits.

11. The method as recited in claim 10 further comprising a step of selecting one of the waveforms displayed as the eye pattern wherein only the selected waveform is displayed.

12. The method as recited in claim 8 wherein selectable bit patterns are provided in the step of selecting the desired bit.

13. The method as recited in claim 8 further comprising a step of designating an arbitrary number of bits in the digital signal.

14. The method as recited in claim 13 further comprising a step of designating an arbitrary number of consecutive bits in the digital signal.

* * * * *